United States Patent
Bilodeau et al.

(10) Patent No.: US 10,957,547 B2
(45) Date of Patent: Mar. 23, 2021

(54) FORMULATIONS TO SELECTIVELY ETCH SILICON GERMANIUM RELATIVE TO GERMANIUM

(71) Applicant: Entegris, Inc., Billerica, MA (US)

(72) Inventors: Steven Bilodeau, Oxford, CT (US); Emanuel I. Cooper, Scarsdale, NY (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 15/742,334

(22) PCT Filed: Jul. 7, 2016

(86) PCT No.: PCT/US2016/041271
§ 371 (c)(1),
(2) Date: Jan. 5, 2018

(87) PCT Pub. No.: WO2017/007893
PCT Pub. Date: Jan. 12, 2017

(65) Prior Publication Data
US 2018/0197746 A1    Jul. 12, 2018

Related U.S. Application Data

(60) Provisional application No. 62/190,560, filed on Jul. 9, 2015.

(51) Int. Cl.
H01L 21/306        (2006.01)
C09K 13/08         (2006.01)
C09K 13/06         (2006.01)

(52) U.S. Cl.
CPC ........ *H01L 21/30604* (2013.01); *C09K 13/06* (2013.01); *C09K 13/08* (2013.01)

(58) Field of Classification Search
CPC ......... H01L 21/30604; H01L 21/30608; H01L 21/30617; H01L 29/66621; H01L 2924/01032; C09K 13/06; C09K 13/08
See application file for complete search history.

(56) References Cited

U.S. PATENT DOCUMENTS

| | | | |
|---|---|---|---|
| 6,316,370 B1 * | 11/2001 | Mercaldi | H01L 21/32134 252/79.1 |
| 8,389,418 B2 | 3/2013 | Epton | |
| 2005/0169096 A1 | 8/2005 | Lee | |
| 2008/0194082 A1 | 8/2008 | Kato | |
| 2009/0017636 A1 | 1/2009 | Kumazawa | |
| 2009/0246967 A1 | 10/2009 | Yaguchi et al. | |
| 2010/0304570 A1 * | 12/2010 | Horie | H01L 21/30621 438/710 |
| 2011/0287634 A1 | 11/2011 | Barr et al. | |
| 2013/0109191 A1 * | 5/2013 | Le Tiec | H01L 21/30604 438/752 |
| 2013/0196497 A1 | 8/2013 | Shimada et al. | |
| 2015/0027978 A1 | 1/2015 | Barnes et al. | |
| 2016/0343576 A1 * | 11/2016 | Bilodeau | H01L 21/30604 |

FOREIGN PATENT DOCUMENTS

| | | | | |
|---|---|---|---|---|
| CN | 1855446 A | 11/2006 | | |
| JP | 2002541662 A | 12/2002 | | |
| JP | 2003183652 A * | 7/2003 | | C09K 13/08 |
| JP | 2007019323 | 1/2007 | | |
| JP | 2010199525 A | 9/2010 | | |
| JP | 2012504871 | 2/2012 | | |
| KR | 100829826 B1 | 5/2008 | | |
| KR | 1367989 B1 * | 12/2012 | | H01L 21/336 |
| WO | WO-2008135804 A1 * | 11/2008 | | H01L 21/02052 |
| WO | 2010039936 | 4/2010 | | |
| WO | 2014178426 | 11/2014 | | |

OTHER PUBLICATIONS

Machine translation of KR 1367989 B1 (Year: 2012).*
Translated abstract of JP 2003183652 A. (Year: 2003).*

* cited by examiner

*Primary Examiner* — Binx X Tran
*Assistant Examiner* — Mahmoud Dahimene
(74) *Attorney, Agent, or Firm* — Entegris, Inc.

(57) ABSTRACT

Compositions useful for the selective removal of silicon germanium materials relative to germanium-containing materials and silicon-containing materials from a microelectronic device having same thereon. The removal compositions include at least one diol and are tunable to achieve the required SiGe:Ge removal selectivity and etch rates.

18 Claims, No Drawings

FORMULATIONS TO SELECTIVELY ETCH SILICON GERMANIUM RELATIVE TO GERMANIUM

PRIORITY CLAIM

This application claims the benefit from International Application No. PCT/US2016/041271, filed Jul. 7, 2016, which in turn claims priority to U.S. Provisional Patent Application having Ser. No. 62/190,560, filed on Jul. 9, 2015, both of which are incorporated herein by reference in their entireties for all purposes.

FIELD

The present invention relates to a composition and process for selectively etching silicon germanium materials relative to germanium-containing materials and Si-containing materials.

DESCRIPTION OF THE RELATED ART

For the past several decades, the scaling of features in integrated circuits has enabled increased densities of functional units on a semiconductor chip. For example, shrinking transistor size allows for the incorporation of an increased number of memory devices on a chip, leading to the fabrication of products with increased capacity.

In the manufacture of field effect transistors (FETs) for integrated circuit devices, semiconducting crystalline materials other than silicon may be advantageous. An example of one such material is Ge, which offers a number of potentially advantageous features relative to silicon, such as, but not limited to, high charge carrier (hole) mobility, band gap offset, a different lattice constant, and the ability to alloy with silicon to form semiconducting binary alloys of SiGe.

One problem with the use of Ge in modern transistor designs is that the extremely fine features (e.g., 22 nm and below) that are now achieved for silicon FETs aggressively scaled over the years are now difficult to achieve in Ge, often making potential material-based performance gains a wash when implemented in less-aggressively scaled forms. The difficulty in scaling is related to the material properties of Ge, and more particularly difficulty in etching SiGe, which is often employed as an intermediate layer between a Ge active layer (e.g., transistor channel layer) and an underlying silicon substrate material. Presently, SiGe is etched using tetramethylammonium hydroxide (TMAH) at 90° C., but the SiGe/Ge selectivity is poor and the etching conditions (i.e., higher temperature and toxicity of TMAH) undesirable.

An object of the present invention is to provide compositions for the selective removal of silicon germanium materials relative to germanium-containing materials and Si-containing materials, while minimizing the removal or corrosion of other materials that are present on the microelectronic device.

SUMMARY OF THE INVENTION

Embodiments of the invention relate generally to a composition and process for selectively etching silicon germanium materials relative to germanium-containing materials and silicon-containing materials from a microelectronic device comprising same.

In one embodiment, a method of selectively removing silicon germanide material from the surface of a microelectronic device relative to germanium-containing material and silicon-containing material is described, said method comprising contacting a composition with the surface of the microelectronic device for time and temperature necessary to selectively remove silicon germanide material relative to germanium-containing material and silicon-containing material, wherein the composition comprises at least one diol compound, at least one fluoride species, and at least one oxidizing species.

In another embodiment, a kit is described, said kit including, in one or more containers, one or more components adapted to form a composition for selectively removing silicon germanide material from the surface of a microelectronic device relative to germanium-containing material and silicon-containing material, wherein one container comprises at least one oxidizing agent and a second container comprises at least one diol, at least one fluoride, water, optionally at least one buffering agent, and optionally at least one germanium passivation agent, for combining at the fab or the point of use.

In still another embodiment, another kit is described, said kt including, in one or more containers, one or more components adapted to form a composition for selectively removing silicon germanide material from the surface of a microelectronic device relative to germanium-containing material and silicon-containing material, wherein one container comprises at least one oxidizing agent and at least one diol and a second container comprises at least one fluoride, water, optionally at least one buffering agent, and optionally at least one germanium passivation agent, for combining at the fab or the point of use.

In yet another embodiment, a composition is described, said composition comprising at least one diol compound, at least one fluoride species, at least one oxidizing species, optionally at least one buffering species, optionally at least one germanium passivation species, and water.

In another embodiment, a composition for selectively removing silicon germanium material from the surface of a microelectronic device relative to germanium-containing material and silicon-containing material is described, said composition comprising the combination of (a) a concentrate comprising at least one diol compound, at least one fluoride species, optionally at least one buffering species, optionally at least one germanium passivation species, and water, and (b) at least one oxidizing agent.

Other aspects, features and embodiments of the invention will be more fully apparent from the ensuing disclosure and appended claims.

DETAILED DESCRIPTION, AND PREFERRED EMBODIMENTS THEREOF

In general, the present invention relates to compositions that selectively remove silicon germanium materials relative to germanium-containing materials and Si-containing materials, and hence are useful as etchants for at least partial removal of silicon germanium material from a microelectronic device. The present invention discloses how the compositions can be tuned to remove silicon germanium materials relative to Ge-containing materials and Si-containing materials.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

"Silicon" is defined to include, Si, polycrystalline Si, and monocrystalline Si. Silicon may be comprised in silicon-on-insulator (SOI) wafers that may be used, for example, as substrates or part of a substrate for electronic devices such as FETs and integrated circuits. Other types of wafers may also comprise silicon.

As used herein, "silicon-containing materials" includes, but is not limited to, silicon; p-doped silicon; n-doped silicon; silicon oxide, including gate oxides (e.g., thermally or chemically grown $SiO_2$) and TEOS; silicon nitride; thermal oxide; SiOH; SiCOH; titanium silicide; tungsten silicide; nickel silicides; cobalt silicides; and low-k dielectric materials. As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities. It should be appreciated that for the purpose of this application, silicon-containing materials do not include substantial amounts of germanium, i.e., the silicon-containing materials contain less than 5 wt % germanium, preferably less than 2 wt % germanium.

As described herein, the "silicon oxide" or "$SiO_2$" material corresponds to materials that were deposited from a silicon oxide precursor source, e.g., TEOS, thermally deposited silicon oxide, or carbon doped oxides (CDO) deposited using commercially available precursors such as SiLK™, AURORA™, CORAL™, or BLACK DIAMOND™. For the purposes of this description, "silicon oxide" is meant to broadly include $SiO_2$, CDO's, siloxanes and thermal oxides. Silicon oxide or $SiO_2$ material corresponds to pure silicon oxide ($SiO_2$) as well as impure silicon oxide including impurities in the structure.

As used herein, "fluoride" species correspond to species including an ionic fluoride ($F^-$) or covalently bonded fluorine. It is to be appreciated that the fluoride species may be included as a fluoride species or generated in situ.

As defined herein, the "germanium-containing materials" may be a bulk germanium wafer, n-doped germanium, p-doped germanium, a germanium-on-insulator (GOI) wafer in which case the layer is a germanium layer formed on a dielectric layer on top of the substrate, a germanium layer on a substrate, as well as germanium compounds such as titanium germanide, tungsten germanide, nickel germanide, and cobalt germanide. The germanium-containing material can be a continuous layer that at least partially extends over the substrate or can be divided into separate regions. It should be appreciated that for the purpose of this application, germanium-containing materials do not include substantial amounts of silicon, i.e., the germanium-containing materials contain less than 5 wt % silicon, preferably less than 2 wt % silicon.

Silicon-germanium (SiGe) alloys are known in the art and have the general formula $Si_{1-x}Ge_x$. For the purposes of the current disclosure, the formula SiGe will be used to signify the silicon germanium material to be removed.

As used herein, "about" is intended to correspond to ±5% of the stated value.

It is understood that some chemical components naturally include negligible amounts of water when in their lowest energy, i.e., stable, state, particularly as purchased commercially. For the purpose of this description, naturally present water is not considered "added water."

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In a first aspect, a composition for selectively removing silicon germanide material from the surface of a microelectronic device relative to germanium-containing material and silicon-containing material and a method of using same is described, said composition comprising, consisting of, or consisting essentially of at least one diol compound, at least one fluoride species, and at least one oxidizing species. In another embodiment, the composition comprises, consists of, or consists essentially of at least one diol compound, at least one fluoride species, at least one oxidizing species, and water. In still another embodiment, the composition comprises, consists of, or consists essentially of at least one diol compound, at least one fluoride species, at least one oxidizing species, at least one buffering species, and water. In yet another embodiment, the composition comprises, consists of, or consists essentially of at least one diol compound, at least one fluoride species, at least one oxidizing species, at least one germanium passivation species, and water. In another embodiment, the composition comprises, consists of, or consists essentially of at least one diol compound, at least one fluoride species, at least one oxidizing species, at least one buffering species, at least one germanium passivation species, and water.

Diol species contemplated herein include include aliphatic glycols including, but not limited to, ethylene glycol, neopentyl glycol, propylene glycol, 1,3-propanediol, 1,2-butanediol, 1,3-butanediol, 1,4-butanediol, 1,2-pentanediol, 1,3-pentanediol, 1,4-pentanediol, 2,3-butanediol, 3-methyl-1,2-butanediol, 1,5-pentanediol, 2-methyl-1,3-pentanediol, 2,4-pentanediol, 2-methyl-2,4-pentanediol, 2,3-pentanediol, 1,2-hexanediol, 2-ethyl-1,3-hexanediol, 2,5-dimethyl-2,5-hexanediol, 1,2-octanediol and combinations thereof. Species containing more than two hydroxyl groups, such as triols (e.g., glycerol), and species in which there are two available hydroxyls and a third that is esterified or etherified (e.g., glyceryl caprylate, guayacol glyceryl ether) are also contemplated. Preferably, the at least one diol species comprises 1,2-butanediol and/or ethylene glycol. The amount of diol species is in a range from about 30 wt % to about 99 wt %, preferably about 30 wt % to about 60 wt %.

Fluoride species contemplated include, but are not limited to, hexafluorotitanic acid, hexafluorosilicic acid, hexafluorozirconic acid, tetrafluoboric acid, tetrabutylammonium trifluoromethanesulfonate, tetraalkylammonium tetrafluoroborates ($NR_1R_2R_3R_4BF_4$) such as tetrabutylammonium tetrafluoroborate, tetraalkylammonium hexafluorophosphates ($NR_1R_2R_3R_4PF_6$), tetraalkylammonium fluorides ($NR_1R_2R_3R_4F$) (anhydrous or hydrates thereof) such as tetramethylammonium fluoride, ammonium bifluoride, ammonium fluoride, where $R_1$, $R_2$, $R_3$, $R_4$ may be the same as or different from one another and is selected from the group consisting of hydrogen, straight-chained or branched $C_1$-$C_6$ alkyl groups (e.g., methyl, ethyl, propyl, butyl, pentyl, hexyl), $C_1$-$C_6$ alkoxy groups (e.g., hydroxyethyl, hydroxypropyl) substituted or unsubstituted aryl groups (e.g., benzyl). Preferably, the fluoride species comprises hydrofluoric acid and/or ammonium fluoride. The amount of fluoride species is in a range from about 0.01 wt % to about 5 wt %, preferably about 0.1 wt % to 1 wt %.

Oxidizing species contemplated herein include, but are not limited to, hydrogen peroxide, $FeCl_3$, $FeF_3$, $Fe(NO_3)_3$, $Sr(NO_3)_2$, $CoF_3$, $MnF_3$, oxone ($2KHSO_5 \cdot KHSO_4 \cdot K_2SO_4$), periodic acid, iodic acid, vanadium (V) oxide, vanadium (IV,V) oxide, ammonium vanadate, ammonium peroxomonosulfate, ammonium chlorite, ammonium chlorate, ammonium iodate, ammonium nitrate, ammonium perborate, ammonium perchlorate, ammonium periodate, ammonium persulfate, ammonium hypochlorite, ammonium hypobromite, ammonium tungstate, sodium persulfate, sodium hypochlorite, sodium perborate, sodium hypobromite, potassium iodate, potassium permanganate, potassium persulfate, nitric acid, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, ferric nitrate, urea hydrogen peroxide, peracetic acid, methyl-1,4-benzoquinone (MBQ), 1,4-benzoquinone (BQ), 1,2-benzoquinone, 2,6-dichloro-1,4-benzoquinone (DCBQ), toluquinone, 2,6-dimethyl-1,4-benzoquinone (DMBQ), chloranil, alloxan, N-methylmorpholine N-oxide, trimethylamine N-oxide, and combinations thereof. The oxidizing species may be introduced to the composition at the manufacturer, prior to introduction of the composition to the device wafer, or alternatively at the device wafer, i.e., in situ. Preferably, the oxidizing species comprises a quinone compound (e.g., DCBQ), hydrogen peroxide, peracetic acid, ammonium iodate, or any combination thereof. When present, the amount of oxidizing species is in a range from about 0.01 wt % to about 10 wt %, preferably about 0.1 wt % to 1 wt %.

If a quinone is used as the oxidant, a concentrated solution (e.g., 5-15%) of the quinone in an oxidation-resistant, preferably aprotic solvent, e.g., sulfolane, tetraglyme, and combinations thereof, can be used as the source of quinone to be added to the formulation shortly before use. For example, the quinone can be DCBQ and it can be dissolved in a mixture of sulfolane and tetraglyme. The quinone/aprotic solvent mixture, e.g., DCBQ/sulfolane/tetraglyme mixture, can be considered the "at least one oxidizing agent" for the purposes of the compositions, kits, and methods described herein.

When present, the at least one buffering species is added to maintain the pH of the solution in a range from about 1 to about 5, preferably about 1.5 to about 4. Buffering species contemplated include, but are not limited to, methanesulfonic acid, oxalic acid dihydrate, citric acid, tartaric acid, picolinic acid, succinic acid, acetic acid, lactic acid, sulfosuccinic acid, benzoic acid, propionic acid, formic acid, pyruvic acid, maleic acid, malonic acid, fumaric acid, malic acid, ascorbic acid, mandelic acid, heptanoic acid, butyric acid, valeric acid, glutaric acid, phthalic acid, hypophosphorous acid, salicylic acid, 5-sulfosalicylic acid, hydrochloric acid, ethanesulfone acid, butanesulfonic acid, p-toluenesulfonic acid, dichloroacetic acid, difluoroacetic acid, monochloroacetic acid, monofluoroacetic acid, hydrochloric acid, trichloroacetic acid, trifluoroacetic acid, hydrobromic acid (62 wt %), sulfuric acid, ammonium acetate, sodium acetate, potassium acetate, tetramethylammonium acetate and other tetraalkylammonium acetates, phosphonium acetate, ammonium butyrate, ammonium trifluoroacetate, phosphoric acid, diammonium monohydrogen phosphate, ammonium dihydrogen phosphate, bis(tetramethylammonium) monohydrogen phosphate, disodium monohydrogen phosphate, sodium dihydrogen phosphate, dipotassium monohydrogen phosphate, potassium dihydrogen phosphate, ditetraalkylammonium monohydrogen phosphate, ditetraalkylammonium dihydrogen phosphate, diphosphonium monohydrogen phosphate, phosphonium dihydrogen phosphate, ammonium phosphonate, tetraalkylammonium phosphonate, sodium phosphonate, potassium phosphonate, phosphonium phosphonate, salts thereof, and combinations thereof. Preferably, the at least one buffering species comprises oxalic acid dihydrate. When present, the amount of buffering species is in a range from about 0.01 wt % to about 10 wt %, preferably about 0.1 wt % to 3 wt %, although it will be appreciated by the person skilled in the art that the amount is dependent on the buffering species chosen for use.

An optional component of the composition described herein is at least one passivation agent for the germanium. Passivation agents can include, but are not limited to, ascorbic acid, L(+)-ascorbic acid, isoascorbic acid, ascorbic acid derivatives, boric acid, ammonium biborate, borate salts (e.g., ammonium pentaborate, sodium tetraborate, and ammonium biborate), alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, sodium bromide, potassium bromide, rubidium bromide, magnesium bromide, calcium bromide, ammonium bromides having the formula $NR^1R^2R^3R^4Br$, wherein $R^1$, $R^2$, $R^3$ and can be the same as or different from one another and are selected from the group consisting of hydrogen and branched or straight-chained $C_1$-$C_6$ alkyls (e.g., methyl, ethyl, propyl, butyl, pentyl, hexyl). Preferably, the at least one germanium passivation agent comprises histidine. When present, the amount of passivation agent is in a range from about 0.01 wt % to about 5 wt %, preferably about 0.1 wt % to 1 wt %.

It should be appreciated that the composition can be tuned to alter the etch rates of the silicon germanium materials relative to the germanium-containing materials and the silicon-containing materials, as readily understood and determined by the person skilled in the art. Most preferably, the selectivity of silicon germanium:germanium-containing compounds (SiGe:Ge) at 25° C. is greater than 5:1, more preferably greater than 10:1, and most preferably equal to or greater than 15:1, with silicon germanium material etch rates greater than about 10 Å/min, more preferably greater than 50 Å/min.

It will be appreciated that it is common practice to make concentrated forms of the compositions to be diluted prior to use. For example, the compositions may be manufactured in a more concentrated form and thereafter diluted with water, additional water, at least one oxidizing agent, at least one diol, or additional diol(s) at the manufacturer, before use, and/or during use at the fab. Dilution ratios may be in a range from about 0.1 part diluent:1 part composition concentrate to about 100 parts diluent:1 part composition concentrate. Alternatively, the concentrate can comprise at least one diol compound, at least one fluoride species, optionally at least one buffering species, optionally at least one germanium passivation species, and water and can be combined with the at least one oxidizing agent before or at the point of use. The ratio of concentrate to at least one oxidizing agent is in the range from about 100:1 to about 10:1, preferably about 50:1 to about 30:1.

The compositions described herein are easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the composition, i.e., more dilute or more concentrated, and it will be appreciated that the compositions can variously and alternatively comprise, consist or consist essentially of any combination of ingredients consistent with the disclosure herein.

Accordingly, a second aspect relates to a kit including, in one or more containers, one or more components adapted to form the compositions described herein. The containers of the kit must be suitable for storing and shipping said composition components, for example, NOWPak® containers (Entegris, Inc., Billerica, Mass., USA). Preferably, one container comprises the at least one oxidizing agent and a second container comprises the remaining components, e.g., at least one diol, at least one fluoride, water, optionally at least one buffering agent, and optionally at least one germanium passivation agent, for combining at the fab or the point of use. For example, in one embodiment, one container comprises the at least one oxidizing agent and a second container comprises the remaining components, e.g., at least one diol, at least one fluoride, water, at least one buffering agent, and at least one germanium passivation agent, for combining at the fab or the point of use. In another embodiment, one container comprises the at least one oxidizing agent and at least one diol and a second container comprises the remaining components, e.g., at least one fluoride, water, optionally at least one buffering agent, and optionally at least one germanium passivation agent, for combining at the fab or the point of use. The one or more containers which contain the components of the composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and PCT/US08/63276 entitled "SYSTEMS AND METHODS FOR MATERIAL BLENDING AND DISTRIBUTION" filed on May 9, 2008.

In a third aspect, the invention relates to methods of using the compositions described herein. For example, a method of selectively removing silicon germanium material from the surface of a microelectronic device relative to germanium-containing material and silicon-containing material using the composition is contemplated.

In removal applications, the composition is applied in any suitable manner to the surface of the microelectronic device, e.g., by spraying the composition on the surface of the device, by dipping (in a static or dynamic volume of the composition) of the device, by contacting the device with another material, e.g., a pad, or fibrous sorbent applicator element, that has the composition absorbed thereon, by contacting the device with a circulating composition, or by any other suitable means, manner or technique, by which the composition is brought into removal contact with the silicon germanium materials and the germanium-containing materials. The application may be in a batch or single wafer apparatus, for dynamic or static cleaning.

In use of the compositions described herein, the composition typically is contacted with the device structure for a sufficient time of from about 1 minute to about 200 minutes, preferably about 5 minutes to about 60 minutes, at temperature in a range of from about 20° C. to about 100° C., preferably about 25° C. to about 70° C. Such contacting times and temperatures are illustrative, and any other suitable time and temperature conditions may be employed that are efficacious to achieve the required removal selectivity.

Following the achievement of the desired etching action, the composition can be readily removed from the microelectronic device to which it has previously been applied, e.g., by rinse, wash, or other removal step(s), as may be desired and efficacious in a given end use application of the compositions of the present invention. For example, the device may be rinsed with a rinse solution including deionized water and/or dried (e.g., spin-dry, $N_2$, vapor-dry etc.). If germanium or a high-germanium film is exposed, the preferred rinse is substantially non-aqueous, e.g., isopropyl alcohol (IPA).

Yet another aspect of the invention relates to the improved microelectronic devices made according to the methods described herein and to products containing such microelectronic devices.

Another aspect of the invention relates to an article of manufacture comprising, consisting of or consisting essentially of a microelectronic device substrate, a silicon germanium material, a germanium-containing material, and a composition as described herein.

Still another aspect relates to a composition for selectively removing silicon germanium material from the surface of a microelectronic device relative to germanium-containing material and silicon-containing material, said composition comprising the combination of (a) a concentrate comprising at least one diol compound, at least one fluoride species, optionally at least one buffering species, optionally at least one germanium passivation species, and water, and (b) at least one oxidizing agent.

The features and advantages of the invention are more fully shown by the illustrative examples discussed below.

Example 1

In order to ensure maximum shelf life, two solutions are produced and mixed prior to use, as follows:
Container A: 0.1-5 wt % oxalic acid dihydrate, 0.1-2 wt % ammonium fluoride, 0.1-2 wt % Histidine, 30-55 wt % ethylene glycol and the balance water.
Container B: 5-15 wt % 2,6-dichloro-1,4-benzoquinone (DCBQ), balance sulfolane:tetraglyme having a 9:1 weight percent ratio.

90-95 parts of Container A were mixed with 5-10 parts Container B before using. The resultant pH was 2.9 and the bath life of the resultant composition exceeded eight hours and the shelf life of the compositions in Containers A and B exceeded six months.

The etch selectivity of Si(0.4)Ge(0.6) relative to Ge of 22:1 was determined by immersing coupons of each in the combined solution at room temperature. The Si(0.4)Ge(0.6) etch rate was determined to be 8.3 nm/minute. In addition, the etch loss of silicon oxide and silicon nitride was determined to be 1.3 nm and 5 nm, respectively, after four minutes.

Example 2

In order to ensure maximum shelf life, two solutions are produced and mixed prior to use, as follows:
Container C: 0.1-2 wt % ammonium fluoride, 0.1-2 wt % hydrofluoric acid, and the balance water.
Container D: 5-15 wt % 2,6-dichloro-1,4-benzoquinone (DCBQ), balance ethylene glycol.

40-60 parts of Container A were mixed with 60-40 parts Container B before using. The resultant pH was 4.7 and the bath life of the resultant composition exceeded six hours and the shelf life of the compositions in Containers C and D exceeded eight weeks.

The etch selectivity of Si(0.4)Ge(0.6) relative to Ge of 5.9:1 was determined by immersing coupons of each in the combined solution at room temperature. The Si(0.4)Ge(0.6) etch rate was determined to be 13.8 nm/minute. In addition, the etch loss of silicon oxide and silicon nitride was determined to be 2.8 nm and 7.4 nm, respectively, after four minutes.

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A method of removing silicon germanide material from the surface of a microelectronic device comprising silicon germanide material, germanium-containing material, and silicon-containing material, said method comprising contacting a composition with the surface of the microelectronic device for time and temperature necessary to remove the silicon germanide material, the composition comprising 30 wt % to 99 wt % of at least one diol compound, 0.01 wt % to 5 wt % of at least one fluoride species, 0.01 wt % to 10 wt % of at least one oxidizing species, and added water, the at least one oxidizing species comprising a species selected from the group consisting of $FeCl_3$, $FeF_3$, $Fe(NO_3)_3$, $Sr(NO_3)_2$, $CoF_3$, $MnF_3$, oxone ($2KHSO_5 \cdot KHSO_4 \cdot K_2SO_4$), vanadium (V) oxide, vanadium (IV,V) oxide, ammonium vanadate, ammonium peroxomonosulfate, ammonium chlorite, ammonium chlorate, ammonium iodate, ammonium nitrate, ammonium perborate, ammonium perchlorate, ammonium periodate, ammonium persulfate, ammonium hypochlorite, ammonium hypobromite, ammonium tungstate, sodium persulfate, sodium hypochlorite, sodium perborate, sodium hypobromite, potassium iodate, potassium permanganate, potassium persulfate, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, ferric nitrate, urea hydrogen peroxide, methyl-1,4-benzoquinone (MBQ), 1,4-benzoquinone (BQ), 1,2-benzoquinone, 2,6-dichloro-1,4-benzoquinone (DCBQ), toluquinone, 2,6-dimethyl-1,4-benzoquinone (DMBQ), chloranil, alloxan, N-methylmorpholine N-oxide, trimethylamine N-oxide, and combinations thereof, wherein the silicon germanide material is a silicon-germanium alloy comprising silicon and germanium;

the germanium-containing material comprises at least one of a bulk germanium wafer, n-doped germanium, p-doped germanium, a germanium-on-insulator (GOI) wafer, a germanium layer on a substrate, and germanium compounds selected from the group consisting of titanium germanide, tungsten germanide, nickel germanide, and cobalt germanide; and the silicon-containing material comprises at least one of silicon; n-doped silicon; p-doped silicon; silicon oxide, gate oxides; TEOS; silicon nitride; thermal oxide; SiOH; SiCOH; titanium silicide; tungsten silicide; nickel silicides; cobalt silicides; and low-k dielectric materials.

2. The method of claim 1 wherein the at least one diol species comprises a species selected from the group consisting of ethylene glycol, neopentyl glycol, propylene glycol, 1,3-propanediol, 1,2-butanediol, 1,3-butanediol, 1,4-butanediol, 1,2-pentanediol, 1,3-pentanediol, 1,4-pentanediol, 2,3-butanediol, 3-methyl-1,2-butanediol, 1,5-pentanediol, 2-methyl-1,3-pentanediol, 2,4-pentanediol, 2-methyl-2,4-pentanediol, 2,3-pentanediol, 1,2-hexanediol, 2-ethyl-1,3-hexanediol, 2,5-dimethyl-2,5-hexanediol, 1,2-octanediol and combinations thereof.

3. The method of claim 1, wherein the at least one fluoride species comprises a species selected from the group consisting of hydrofluoric acid, hexafluorotitanic acid, hexafluorosilicic acid, hexafluorozirconic acid, tetrafluoboric acid, tetrabutylammonium trifluoromethanesulfonate, tetraalkylammonium tetrafluoroborates ($NR_1R_2R_3R_4BF_4$), tetraalkylammonium hexafluorophosphates ($NR_1R_2R_3R_4PF_6$), tetraalkylammonium fluorides ($NR_1R_2R_3R_4F$), ammonium bifluoride, ammonium fluoride, and combinations thereof, where $R_1$, $R_2$, $R_3$, $R_4$ may be the same as or different from one another and is selected from the group consisting of hydrogen, straight-chained or branched $C_1$-$C_6$ alkyl groups, $C_1$-$C_6$ alkoxy groups, or substituted or unsubstituted aryl groups.

4. The method of claim 1, wherein the at least one oxidizing species comprises a species selected from the group consisting of methyl-1,4-benzoquinone (MBQ), 1,4-benzoquinone (BQ), 1,2-benzoquinone, 2,6-dichloro-1,4-benzoquinone (DCBQ), toluquinone, 2,6-dimethyl-1,4-benzoquinone (DMBQ), and combinations thereof.

5. The method of claim 1, wherein the composition further comprises at least one buffering species selected from the group consisting of methanesulfonic acid, oxalic acid dihydrate, citric acid, tartaric acid, picolinic acid, succinic acid, acetic acid, lactic acid, sulfosuccinic acid, benzoic acid, propionic acid, formic acid, pyruvic acid, maleic acid, malonic acid, fumaric acid, malic acid, ascorbic acid, mandelic acid, heptanoic acid, butyric acid, valeric acid, glutaric acid, phthalic acid, hypophosphorous acid, salicylic acid, 5-sulfosalicylic acid, hydrochloric acid, ethanesulfone acid, butanesulfonic acid, p-toluenesulfonic acid, dichloroacetic acid, difluoroacetic acid, monochloroacetic acid, monofluoroacetic acid, hydrochloric acid, trichloroacetic acid, trifluoroacetic acid, hydrobromic acid (62 wt %), sulfuric acid, ammonium acetate, sodium acetate, potassium acetate, tetramethylammonium acetate and other tetraalkylammonium acetates, phosphonium acetate, ammonium butyrate, ammonium trifluoroacetate, phosphoric acid, diammonium monohydrogen phosphate, ammonium dihydrogen phosphate, bis(tetramethylammonium) monohydrogen phosphate, disodium monohydrogen phosphate, sodium dihydrogen phosphate, dipotassium monohydrogen phosphate, potassium dihydrogen phosphate, ditetraalkylammonium monohydrogen phosphate, ditetraalkylammonium dihydrogen phosphate, diphosphonium monohydrogen phosphate, phosphonium dihydrogen phosphate, ammonium phosphonate, tetraalkylammonium phosphonate, sodium phosphonate, potassium phosphonate, phosphonium phosphonate, salts thereof, and combinations thereof.

6. The method of claim 1, wherein the composition further comprises at least one germanium passivation agent selected from the group consisting of ascorbic acid, L(+)-ascorbic acid, isoascorbic acid, ascorbic acid derivatives, boric acid, ammonium biborate, borate salts (e.g., ammonium pentaborate, sodium tetraborate, and ammonium biborate), alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, sodium bromide, potassium bromide, rubidium bromide, magnesium bromide, calcium bromide, ammonium bromides having the formula $NR_1R_2R_3R_4Br$, wherein $R_1$, $R_2$, $R_3$ and $R_4$ can be the same as or different from one another and are selected from the group consisting of hydrogen and branched or straight-chained $C_1$-$C_6$ alkyls.

7. The method of claim 1, wherein the composition has a pH in a range from about 1 to about 5.

8. The method of claim 1, wherein silicon-containing material is removed at a lower etch rate than silicon germanium material.

9. The method of claim 1, wherein the at least one diol species comprises 1,2-butanediol, ethylene glycol, and combinations thereof.

10. A kit including, in one or more containers, one or more components adapted to form a composition for removing silicon germanide material from the surface of a microelectronic device comprising silicon germanide material, germanium-containing material and silicon-containing material, wherein one container comprises at least one oxidizing agent comprising a species selected from the group consisting of $FeCl_3$, $FeF_3$, $Fe(NO_3)_3$, $Sr(NO_3)_2$, $CoF_3$, $MnF_3$, oxone ($2KHSO_5 \cdot KHSO_4 \cdot K_2SO_4$), vanadium (V) oxide, vanadium (IV,V) oxide, ammonium vanadate, ammonium peroxomonosulfate, ammonium chlorite, ammonium chlorate, ammonium iodate, ammonium nitrate, ammonium perborate, ammonium perchlorate, ammonium periodate, ammonium persulfate, ammonium hypochlorite, ammonium hypobromite, ammonium tungstate, sodium persulfate, sodium hypochlorite, sodium perborate, sodium hypobromite, potassium iodate, potassium permanganate, potassium persulfate, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, ferric nitrate, urea hydrogen peroxide, methyl-1,4-benzoquinone (MBQ), 1,4-benzoquinone (BQ), 1,2-benzoquinone, 2,6-dichloro-1,4-benzoquinone (DCBQ), toluquinone, 2,6-dimethyl-1,4-benzoquinone (DMBQ), chloranil, alloxan, N-methylmorpholine N-oxide, trimethylamine N-oxide, and combinations thereof, and a second container comprises at least one diol, at least one fluoride, added water, optionally at least one buffering agent, and optionally at least one germanium passivation agent, for combining at a fab or a point of use.

11. A composition comprising 30 wt % to 99 wt % of at least one diol compound, 0.01 wt % to 5 wt % of at least one fluoride species, 0.01 wt % to 10 wt % of at least one oxidizing species, 0.01 wt % to 10 wt % of at least one buffering species, 0.01 wt % to 5 wt % of at least one germanium passivation species, and added water, wherein the at least one oxidizing agent comprises a species selected from the group consisting of hydrogen peroxide, $FeCl_3$, $FeF_3$, $Fe(NO_3)_3$, $Sr(NO_3)_2$, $CoF_3$, $MnF_3$, oxone ($2KHSO_5 \cdot KHSO_4 \cdot K_2SO_4$), vanadium (V) oxide, vanadium (IV,V) oxide, ammonium vanadate, ammonium peroxomonosulfate, ammonium chlorite, ammonium chlorate, ammonium iodate, ammonium nitrate, ammonium perborate, ammonium perchlorate, ammonium periodate, ammonium persulfate, ammonium hypochlorite, ammonium hypobromite, ammonium tungstate, sodium persulfate, sodium hypochlorite, sodium perborate, sodium hypobromite, potassium iodate, potassium permanganate, potassium persulfate, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, ferric nitrate, urea hydrogen peroxide, methyl-1,4-benzoquinone (MBQ), 1,4-benzoquinone (BQ), 1,2-benzoquinone, 2,6-dichloro-1,4-benzoquinone (DCBQ), toluquinone, 2,6-dimethyl-1,4-benzoquinone (DMBQ), chloranil, alloxan, N-methylmorpholine N-oxide, trimethylamine N-oxide, and combinations thereof.

12. The composition of claim 11, wherein the composition has a pH in a range from about 1 to about 5.

13. The composition of claim 11, wherein the at least one diol species comprises a species selected from the group consisting of ethylene glycol, neopentyl glycol, propylene glycol, 1,3-propanediol, 1,2-butanediol, 1,3-butanediol, 1,4-butanediol, 1,2-pentanediol, 1,3-pentanediol, 1,4-pentanediol, 2,3-butanediol, 3-methyl-1,2-butanediol, 1,5-pentanediol, 2-methyl-1,3-pentanediol, 2,4-pentanediol, 2-methyl-2,4-pentanediol, 2,3-pentanediol, 1,2-hexanediol, 2-ethyl-1,3-hexanediol, 2,5-dimethyl-2,5-hexanediol, 1,2-octanediol and combinations thereof.

14. The composition of claim 11, wherein the at least one fluoride species comprises a species selected from the group consisting of hydrofluoric acid, hexafluorotitanic acid, hexafluorosilicic acid, hexafluorozirconic acid, tetrafluoboric acid, tetrabutylammonium trifluoromethanesulfonate, tetraalkylammonium tetrafluoroborates ($NR_1R_2R_3R_4BF_4$), tetraalkylammonium hexafluorophosphates ($NR_1R_2R_3R_4PF_6$), tetraalkylammonium fluorides ($NR_1R_2R_3R_4F$), ammonium bifluoride, ammonium fluoride, and combinations thereof, where $R_1$, $R_2$, $R_3$, $R_4$ may be the same as or different from one another and is selected from the group consisting of hydrogen, straight-chained or branched $C_1$-$C_6$ alkyl groups, $C_1$-$C_6$ alkoxy groups, or substituted or unsubstituted aryl groups.

15. The composition of claim 11, wherein the at least one oxidizing species comprises a species selected from the group consisting of methyl-1,4-benzoquinone (MBQ), 1,4-benzoquinone (BQ), 1,2-benzoquinone, 2,6-dichloro-1,4-benzoquinone (DCBQ), toluquinone, 2,6-dimethyl-1,4-benzoquinone (DMBQ), and combinations thereof.

16. The composition of claim 11, wherein the at least one buffering species is selected from the group consisting of methanesulfonic acid, oxalic acid dihydrate, citric acid, tartaric acid, picolinic acid, succinic acid, acetic acid, lactic acid, sulfosuccinic acid, benzoic acid, propionic acid, formic acid, pyruvic acid, maleic acid, malonic acid, fumaric acid, malic acid, ascorbic acid, mandelic acid, heptanoic acid, butyric acid, valeric acid, glutaric acid, phthalic acid, hypophosphorous acid, salicylic acid, 5-sulfosalicylic acid, hydrochloric acid, ethanesulfone acid, butanesulfonic acid, p-toluenesulfonic acid, dichloroacetic acid, difluoroacetic acid, monochloroacetic acid, monofluoroacetic acid, hydrochloric acid, trichloroacetic acid, trifluoroacetic acid, hydrobromic acid (62 wt %), sulfuric acid, ammonium acetate, sodium acetate, potassium acetate, tetramethylammonium acetate and other tetraalkylammonium acetates, phosphonium acetate, ammonium butyrate, ammonium trifluoroacetate, phosphoric acid, diammonium monohydrogen phosphate, ammonium dihydrogen phosphate, bis(tetramethylammonium) monohydrogen phosphate, disodium monohydrogen phosphate, sodium dihydrogen phosphate, dipotassium monohydrogen phosphate, potassium dihydrogen phosphate, ditetraalkylammonium monohydrogen phosphate, ditetraalkylammonium dihydrogen phosphate, diphosphonium monohydrogen phosphate, phosphonium dihydrogen phosphate, ammonium phosphonate, tetraalkylammonium phosphonate, sodium phosphonate, potassium phosphonate, phosphonium phosphonate, salts thereof, and combinations thereof.

17. The composition of claim 11, wherein the at least one germanium passivation species is selected from the group consisting of ascorbic acid, L(+)-ascorbic acid, isoascorbic acid, ascorbic acid derivatives, boric acid, ammonium biborate, borate salts (e.g., ammonium pentaborate, sodium tetraborate, and ammonium biborate), alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, sodium bromide, potassium bromide, rubidium bromide, magnesium bromide, calcium bromide, ammonium bromides having the formula $NR_1R_2R_3R_4Br$, wherein $R_1$, $R_2$, $R_3$ and $R_4$ can be the same as or different from one another and are selected from the group consisting of hydrogen and branched or straight-chained $C_1$-$C_6$ alkyls.

18. The composition of claim 11, wherein the at least one diol species comprises 1,2-butanediol, ethylene glycol, and combinations thereof.

\* \* \* \* \*